(12) United States Patent
Hirata

(10) Patent No.: US 6,195,375 B1
(45) Date of Patent: Feb. 27, 2001

(54) SELF-PULSATION TYPE SEMICONDUCTOR LASER

(75) Inventor: Shoji Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/233,953

(22) Filed: Jan. 20, 1999

(30) Foreign Application Priority Data

Feb. 2, 1998 (JP) .................................................. 10-021225

(51) Int. Cl.$^7$ ...................................................... H01S 3/19
(52) U.S. Cl. ..................... 372/46; 372/43; 372/44; 372/45; 372/50
(58) Field of Search ................................ 372/43, 44, 45, 372/46, 47, 48, 50

(56) References Cited

U.S. PATENT DOCUMENTS

| | | | | |
|---|---|---|---|---|
| 5,923,688 | * | 7/1999 | Nakamura | 372/45 |
| 5,963,573 | * | 10/1999 | Haase et al. | 372/46 |
| 5,966,397 | * | 10/1999 | Hirata | 372/46 |
| 5,991,321 | * | 11/1999 | Duggan | 372/45 |
| 6,002,701 | * | 12/1999 | Kan et al. | 372/46 |
| 6,028,875 | * | 2/2000 | Knight et al. | 372/46 |
| 6,084,898 | * | 7/2000 | Heffernan et al. | 372/45 |

* cited by examiner

Primary Examiner—Brian Healy
(74) Attorney, Agent, or Firm—Sonnenschein, Nath & Rosenthal

(57) ABSTRACT

A self-pulsation type semiconductor laser having a high yield in manufacture and capable of stable self-pulsation when operating at a high temperature and at a high output, wherein in order to generate stable pulsation, the current is designed not to spread in the horizontal direction of the active layer and a wide saturable absorbing region is secured so as to spread the light spot. Therefore, the thickness d of the p-type AlGaInP clad layer with the current narrowing layer is set to be, for example, $d \leq 400$ nm, preferably $d \leq 350$ nm and wherein to keep the refractive index difference $\Delta n$ ($= n1-n2$) between the portion of the waveguide in the horizontal direction corresponding to the stripe portion and portions corresponding to the two sides thereof at a small value between 0.001 and 0.003 capable of continuously generating pulsation, the thickness of a guide layer on the n-type AlGaInP clad layer side is made thicker than that of a guide layer on the p-type AlGaInP clad layer to make the SCH structure asymmetrical.

36 Claims, 7 Drawing Sheets

SELF-PULSATION TYPE SEMICONDUCTOR LASER

BACKGROUND OF THE INVENTION

1. Field of the Invention

The present invention relates to a self-pulsation type semiconductor laser which realizes multi-modes by causing self-pulsation.

2. Description of the Related Art

A semiconductor laser is used as a light source for an optical disk apparatus etc. At this time, how to suppress the so-called "returning light noise" generated by part of the light reflected from the optical disk striking the semiconductor laser is important.

As one type of semiconductor laser designed to suppress this returning light noise, there is known a so-called "self-pulsation type semiconductor laser" which realizes multi-modes by causing self-pulsation of the semiconductor laser.

FIG. 7 is a cross-sectional view of an example of the configuration of a self-pulsation type semiconductor laser of the related art.

Note that here, a case is shown where an AlGaInP based material is used for configuring the self-pulsation type semiconductor laser.

As shown in FIG. 7, a self-pulsation type semiconductor laser 10 is comprised of an n-type GaAs substrate 11 on which are successively stacked an n-type AlGaInP clad layer 12, a GaInP active layer 13, a p-type AlGaInP clad layer 14, a p-type GaInP intermediate layer 15, and a p-type GaAs cap layer 16.

The upper layer portion of the p-type AlGaInP clad layer 14, the p-type GaInP intermediate layer 15, and the p-type GaAs cap layer 16 have mesa-type stripe shapes extending in one direction.

Namely, a stripe portion 17 is formed by the upper layer of the p-type AlGaInP clad layer 14, the p-type GaInP intermediate layer 15, and the p-type GaAs cap layer 16.

An n-type GaAs current narrowing layer 18 is buried at the portions at the two sides of the stripe portion 17, by which a current narrowing structure is formed.

A p-side electrode 19 such as a Ti/Pt/Au electrode is provided on the p-type GaAs cap layer 16 and the n-type GaAs current narrowing layer 18.

On the other hand, an n-side electrode such as an AuGe/Ni/Au electrode is provided on the other surface of the n-type GaAs substrate 11.

FIG. 8 is a rough graph of the distribution of the refractive index of the self-pulsation type semiconductor laser 10 shown in FIG. 7.

Here, a refractive index distribution parallel to the direction of a pn junction of the self-pulsation type semiconductor laser 10 and perpendicular to a longitudinal direction of the resonator (hereinafter this direction will be referred to as a "horizontal direction") is shown in correspondence with FIG. 7.

As shown in FIG. 8, the self-pulsation type semiconductor laser 10 has a refractive index in the horizontal direction of a high refractive index n1 at a portion corresponding to the stripe portion 17 and of a low refractive index n2 at portions corresponding to the two sides of the stripe portion 17, that is, a so-called "step shaped" refractive index distribution.

In this way, in the self-pulsation type semiconductor laser 10, light is guided in the horizontal direction by changing the refractive index in the horizontal direction in a step manner.

In this case, a refractive index difference Δn (=n1−n2) between a portion corresponding to the stripe portion 17 and portions corresponding to the two sides of it is set to be not more than 0.003, whereby the confinement of light in the horizontal direction by the GaInP active layer 13 is eased.

During operation of the self-pulsation type semiconductor laser 10 configured as above, as shown in FIG. 7, a width WP of the optical waveguide region 22 becomes larger than a width WG of a gain region 21 inside the GaInP active layer 13. Thus, the optical waveguide region 22 outside the gain region 21 becomes a saturable absorbing region 23.

In the self-pulsation type semiconductor laser 10, the change of the refractive index in the horizontal direction is reduced so as to increase the amount of seepage of light in the horizontal direction and increase the interaction between the light and the saturable absorbing region 23 inside the GaInP active layer 13 so as to realize self-pulsation. Accordingly, it is necessary to secure a sufficient saturable absorbing region 23.

Turning now to the problem to be solved by the present invention, as explained above, the self-pulsation type semiconductor laser 10 of the related art has a so-called "ridge configuration" as shown in FIG. 9 and provides a saturable absorbing region (SAR) at the two sides of the optical waveguide inside the active layer to realize self-pulsation.

In this case, as shown in FIG. 9, when a gain region (a width of which is G) inside an active layer generated by the spread of the current is made as narrow as possible and the optical waveguide spot size (a width of which is P) is made conversely made relatively large to fulfill a relationship of P>G, the amount of difference functions as a saturable absorbing region to generate self-pulsation.

For this, specifically, the refractive index difference Δn of the waveguide is made an intermediate guide of about 0.005 to 0.001 between an index guide and a gain guide to fulfill this relationship.

In such a semiconductor laser of the related art, however, since the width of the saturable absorbing region is determined by the delicate balance between the spread of light and the spread of current, there is instability such as a poor yield of the laser generating self-pulsation, a suppressed self-pulsation at the time of high temperature operation due to an increased current diffusion and narrower saturable absorbing region, and similarly a suppressed self-pulsation at the time of high output operation due to an increased current diffusion and narrower saturable absorbing region.

Especially, at a high temperature and high output, the so-called pulsation stops and the problem of noise arises.

Furthermore, a self-pulsation type semiconductor laser generally has a current threshold Ith considerably higher (about 1.5 times) that in an ordinary index guide type or a gain guide type. Also, depending on the system, sharp rising kinks are caused in the so-called L-I characteristic near the current threshold Ith. These have proven to be obstacles in applying the laser.

SUMMARY OF THE INVENTION

An object of the present invention is to provide a self-pulsation type semiconductor laser having a high yield in manufacture and capable of performing stable self-pulsation even when operating at a high temperature and at a high output.

According to a first aspect of the present invention, there is provided a self-pulsation type semiconductor laser, comprising a first conductivity type first clad layer, an active layer formed on the first clad layer; a second conductivity type second clad layer formed on the active layer; a current narrowing structure comprising first conductivity type current narrowing layers buried at portions at the two sides of a stripe portion formed in the second clad layer; saturable absorbing regions formed on the two sides of the active layer inside a laser resonator; and a holding mechanism for holding a predetermined refractive index difference Δn of a waveguide in a horizontal direction parallel to a pn junction and perpendicular to a longitudinal direction of the resonator within a range capable of continuously generating pulsation; a thickness d of the second clad layer outside the waveguide being set to a small value capable of suppressing the spread in the horizontal direction of a current introduced to the active layer through the stripe portion to close to a stripe width W of a bottom portion of the stripe portion.

According to a second aspect of the present invention, there is provided a self-pulsation type semiconductor laser, comprising a first conductivity type first clad layer; an active layer formed on the first clad layer; a second conductivity type second clad layer formed on the active layer; a current narrowing structure comprising first conductivity type current narrowing layers buried at portions at the two sides of a stripe portion formed in the second clad layer; saturable absorbing regions formed on the two sides of the active layer inside a laser resonator; and a holding mechanism for holding a predetermined refractive index difference Δn of a waveguide in a horizontal direction parallel to a pn junction and perpendicular to a longitudinal direction of the resonator within a range capable of continuously generating pulsation by making a thickness of a guide layer at the first conductivity type first clad layer side larger than the thickness of a guide layer at the second conductivity type second clad layer side to make an asymmetric structure; a thickness d of the second clad layer outside the waveguide being set to a small value capable of suppressing the spread in the horizontal direction of a current introduced to the active layer through the stripe portion to close to a stripe width W of a bottom portion of the stripe portion.

According to a third aspect of the present invention, there is provided a self-pulsation type semiconductor laser, comprising a first conductivity type first clad layer; an active layer formed on the first clad layer; a second conductivity type second clad layer formed on the active layer; a current narrowing structure comprising first conductivity type current narrowing layers buried at portions at the two sides of a stripe portion formed in the second clad layer; saturable absorbing regions formed on the two sides of the active layer inside a laser resonator; and a mode pull-in layer in the first conductivity type first clad layer for pulling in a light mode to the first conductivity side so to keep a predetermined refractive index difference Δn of a waveguide in a horizontal direction parallel to a pn junction and perpendicular to a longitudinal direction of the resonator within a range capable of continuously generating pulsation; a thickness d of the second clad layer outside the waveguide being set to a small value capable of suppressing the spread in the horizontal direction of a current introduced to the active layer through the stripe portion to close to a stripe width W of a bottom portion of the stripe portion.

According to a fourth aspect of the present invention, there is provided a self-pulsation type semiconductor laser, comprising a first conductivity type first clad layer; an active layer formed on the first clad layer; a second conductivity type second clad layer formed on the active layer; a current narrowing structure comprising first conductivity type current narrowing layers buried at portions at the two sides of a stripe portion formed in the second clad layer; saturable absorbing regions formed on the two sides of the active layer inside a laser resonator; a holding mechanism for holding a predetermined refractive index difference Δn of a waveguide in a horizontal direction parallel to a pn junction and perpendicular to a longitudinal direction of the resonator within a range capable of continuously generating pulsation by making a thickness of a guide layer at the first conductivity type first clad layer side larger than e thickness of a guide layer at the second conductivity type second clad layer side to make an asymmetric structure; and a mode pull-in layer in the first conductivity type first clad layer for pulling in a light mode to the first conductivity side; a thickness d of the second clad layer outside the waveguide being set to a small value capable of suppressing the spread in the horizontal direction of a current introduced to the active layer through the stripe portion to close to a stripe width W of a bottom portion of the stripe portion.

In the first to the fourth aspects of the present invention, preferably, the refractive index difference Δn is 0.003 to 0.001; the thickness d of the second clad layer is 400 nm or less; the stripe width W of the bottom portion of the stripe portion is 4 μm or less; and, where applicable, the mode pull-in layer is formed by setting the refractive index higher than the refractive index of the first clad layer.

According to a fifth aspect of the present invention, there is provided a self-pulsation type semiconductor laser, comprising a substrate; a first conductivity type first clad layer formed on the substrate; an active layer formed on the first clad layer; a second conductivity type second clad layer formed on the active layer; a cap layer formed on the second clad layer; and a current narrowing layer formed at the two sides of the second clad layer; the active layer having a separate confinement heterostructure (SCH) comprising a first guide layer provided on the first clad layer side and a second guide layer provided on the second clad layer side; a thickness of the first guide layer being larger than the thickness of the second guide layer; and a thickness of the second clad layer between the active layer and the current narrowing layer being 400 nm or less.

According to a sixth aspect of the present invention, there is provided a self-pulsation type semiconductor laser, comprising a substrate; a first conductivity type first clad layer formed on the substrate; an active layer formed on the first clad layer; a second conductivity type second clad layer formed on the active layer; a cap layer formed on the second clad layer; a current narrowing layer formed at the two sides of the second clad layer; and a pull-in layer formed in the first clad layer and having a higher refractive index than the first clad layer; the thickness of the second clad layer between the active layer and the current narrowing layer being 400 nm or less.

According to a seventh aspect of the present invention, there is provided a self-pulsation type semiconductor laser, comprising a substrate; a first conductivity type first clad layer formed on the substrate; an active layer formed on the first clad layer; a second conductivity type second clad layer formed on the active layer; a cap layer formed on the second clad layer; a current narrowing layer formed at the two sides of the second clad layer; and a pull-in layer formed in the first clad layer and having a higher refractive index than the first clad layer; the thickness of the second clad layer between the active layer and the current narrowing layer being 400 nm or less; the active layer having a separate confinement heterostructure (SCH) comprising a first guide layer provided on the first clad layer side and a second guide layer provided on the second clad layer side; and a thickness of the first guide layer being larger than the thickness of the second guide layer.

In the fifth to seventh aspects of the present invention, preferably a stripe portion of the semiconductor laser is formed by the current narrowing layer; the stripe width is 4 μm or less; the active layer comprises an MQW structure; and the pull-in layer is larger than an energy gap of the active layer.

According to the present invention, a current flows at the stripe portion during operation of the self-pulsation type semiconductor laser, but since in this case the thickness d of the second clad layer with the current narrowing layer is set to be sufficiently small, for example, not more than 400 nm, the spread of the current in the horizontal direction is suppressed to about the stripe width W.

Furthermore, since the thickness of the guide layer on the first clad layer side is increased, the SCH structure is made asymmetric, or a mode pull-in layer having a higher refractive index than for example the first clad layer is provided for pulling in a light mode to the first conductivity side, the refractive index difference Δn between the portion of the waveguide in the horizontal direction corresponding to the stripe portion and the portions corresponding to the two sides thereof is kept at a small value between 0.001 and 0.003 able to continuously generate pulsation.

Accordingly, the spread of the light in the horizontal direction becomes larger than the stripe width W and the light is narrowed such as by a so-called index guide. Consequently, the pulsation is generated stably and continuously without the pulsation stopping being produced.

Namely, self-pulsation is performed stably.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
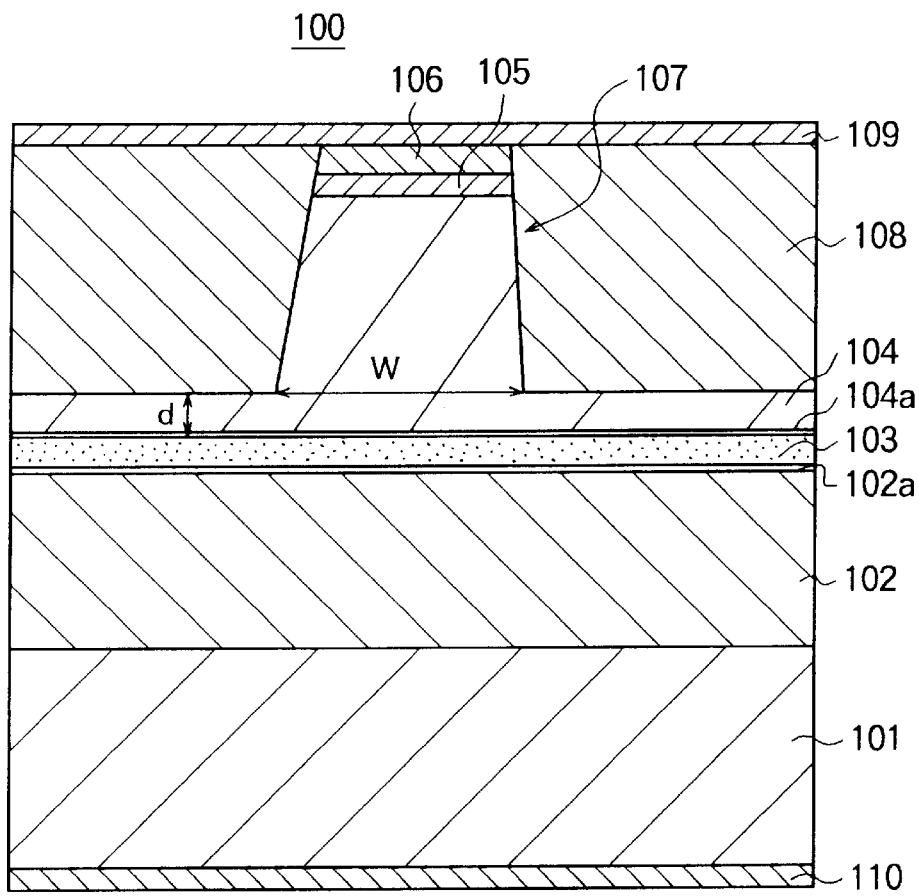
FIG. 1 is a cross-sectional view of a self-pulsation type semiconductor laser according to a first embodiment of the present invention.

FIG. 1 is a cross-sectional view of a self-pulsation type semiconductor laser according to a first embodiment of the present invention.

Note that, here, a case is explained where the self-pulsation type semiconductor laser is configured by forming saturable absorbing regions on the two sides of an active layer inside a laser resonator comprised by an AlGaInP based material.

As shown in FIG. 1, a self-pulsation type semiconductor laser 100 is comprised of an n-type (first conductivity type) GaAs substrate 101 on which are successively stacked an n-type AlGaInP clad layer (first clad layer) 102, a GaInP active layer 103, a p-type (second conductivity type) AlGaInP clad layer (second clad layer) 104, a p-type GaInP intermediate layer 105, and a p-type GaAs cap layer 106.

The upper layer portion of the p-type AlGaInP clad layer 104, the p-type GaInP intermediate layer 105, and the p-type GaAs cap layer 106 have mesa-type stripe shapes extending in one direction.

Namely, a stripe portion 107 is formed by the upper layer of the p-type AlGaInP clad layer 104, the p-type GaInP intermediate layer 105, and the p-type GaAs cap layer 106.

An n-type GaAs current narrowing layer 108 is buried at the portions at the two sides of the stripe portion 107, by which a current narrowing structure is formed.

A p-side electrode 109 such as a Ti/Pt/Au electrode is provided on the p-type GaAs cap layer 106 and the n-type GaAs current narrowing layer 108.

On the other hand, an n-side electrode such as an AuGe/Ni/Au electrode is provided on the other surface of the n-type GaAs substrate 101.

Furthermore, in the self-pulsation type semiconductor laser 100, in order to generate stable pulsation, the current is designed not to spread in the horizontal direction of the active layer and a wide saturable absorbing region is secured so as to spread the light spot. Therefore, the thickness d of the p-type AlGaInP clad layer 104 with the current narrowing layer 108 is set to be, for example, d≦400 nm, preferably d≦350 nm.

Furthermore, in order to keep the refractive index difference Δn (=n1−n2) between the portion of the waveguide in the horizontal direction (direction parallel to a pn junction and perpendicular to a longitudinal direction of the resonator) corresponding to the stripe portion 107 and portions corresponding to the two sides thereof at a small value between 0.001 and 0.003 capable of continuously generating pulsation, the thickness of a guide layer 102a on the n-type AlGaInP clad layer 102 side is made thicker than that of a guide layer 104a on the p-type AlGaInP clad layer to make the SCH structure asymmetrical.

Figure 2:
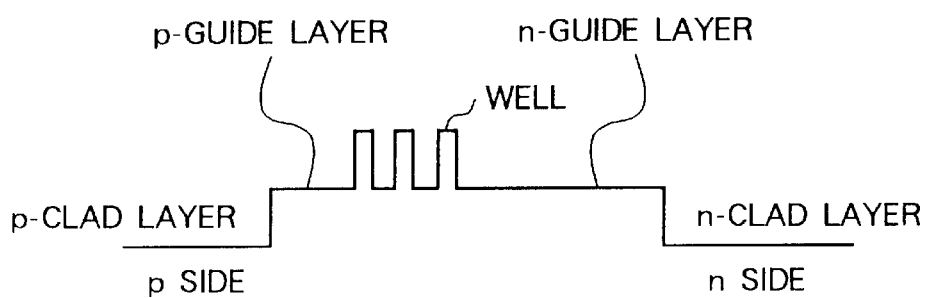
FIG. 2 is a view of a refractive index distribution over an n-type AlGaInP clad layer, a GaInP active layer, and a p-type AlGaInP clad layer of the self-pulsation type semiconductor laser in FIG. 1 with an asymmetrical SCH structure.

FIG. 2 is a view of the refractive index distribution over layers of the n-type AlGaInP clad layer 102, the GaInP active layer 103, and the p-type AlGaInP clad layer 104 in the self-pulsation type semiconductor laser 100 in FIG. 1 with an asymmetrical SCH structure.

By realizing such an asymmetrical structure, the so-called light mode is pulled to the n-side so that even when the thickness d of the p-type AlGaInP clad layer 104 with the current narrowing layer 108 is set to a small value of not more than 400 nm, it is possible to keep the refractive index difference Δn in-the horizontal direction a small value between 0.001 and 0.003.

Note that the laser is configured so that the degree of the asymmetry is from 0.003 to 0.001 in terms of the refractive index difference Δn or 0.002 to 0.0012 if possible.

Also, in the self-pulsation type semiconductor laser 100, the stripe width W of the mesa-shaped bottom portion is set to be W≦4.0 μm.

Figure 3:
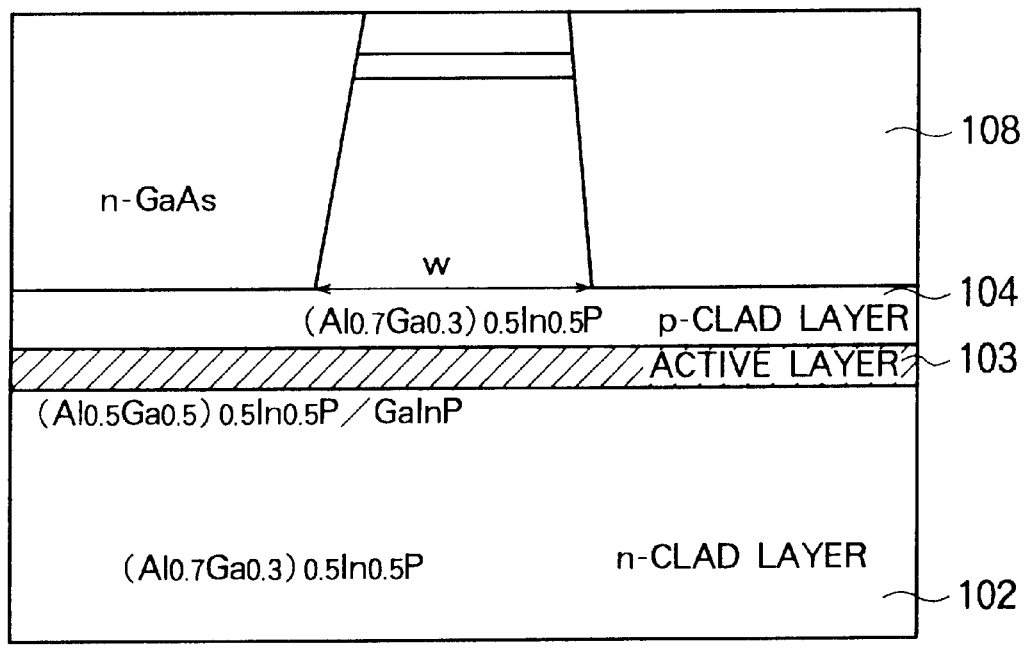
FIG. 3 is a view of the proportions of the components of the compounds of an n-type AlGaInP clad layer, a GaInP active layer 103, and a p-type AlGaInP clad layer in the self-pulsation type semiconductor laser in FIG. 1.

FIG. 3 shows proportions of the components of the compounds of the n-type AlGaInP clad layer 102, active layer 103, and p-type AlGaInP clad layer 104 in the self-pulsation type semiconductor laser 100 of FIG. 1.

As shown in FIG. 3, the n-type clad layer 102 is formed to be $(Al_{0.7}Ga_{0.3})_{0.5}In_{0.5}P$, the region on the n-type guide layer side including the active layer 103 is formed to be $(Al_{0.5}Ga_{0.5})_{0.5}In_{0.5}P/GaInP$, and the p-type clad layer 103 is formed to be $(Al_{0.7}Ga_{0.3})_{0.5}In_{0.5}P$.

The method of manufacture of the self-pulsation type semiconductor laser 100 having the above structure will be explained below.

First, an n-type AlGaInP clad layer 102, an n-type guide layer 102a, a GaInP active layer 103, a p-type guide layer 104a, a p-type AlGaInP clad layer 104, a p-type GaInP intermediate layer 105, and a p-type GaAs cap layer 106 are successively grown on an n-type GaAs substrate 101 by, for example, the metal organic chemical vapor deposition (MOCVD) method.

Also, at this time, the thickness of the guide layer 102a on the n-type AlGaInP clad layer 102 side is increased to make the SCH structure asymmetrical.

Next, a resist pattern of a predetermined shape is formed on the p-type GaAs cap layer 106, then the resist pattern is used as an etching mask to etch the p-type GaAs cap layer 106, p-type GaInP intermediate layer 105, and p-type AlGaInP clad layer 104 to a predetermined depth in the thickness direction of the p-type AlGaInP clad layer 104 by the wet etching method using an oxalate based etchant etc.

As a result, the upper layer of the p-type AlGaInP clad layer 104, p-type GaInP intermediate layer 105, and p-type GaAs cap layer 106 are patterned to form stripe shapes of predetermined widths extending in one direction. Namely, a stripe portion 107 is formed and the thickness d is set to, for example, 400 nm or less.

Next, using the resist pattern used for the etching mask as a growth mask, an n-type GaAs current narrowing layer 108 is formed at the portions at the two sides of the stripe portion 107.

Next, the resist pattern used as the growth mask is removed, then a p-side electrode 109 is formed on the p-type GaAs cap layer 106 and the n-type current narrowing layer 108 and an n-side electrode 110 is formed on the opposite side of the n-type GaAs substrate 101.

By the above, the self-pulsation type semiconductor laser 100 is completed.

Next, the operation due to the above configuration will be explained.

When the self-pulsation type semiconductor laser 100 is operating, a current flows through the stripe portion 107. In this case, since the thickness d of the p-type AlGaInP clad layer 104 with the current narrowing layer 108 is set to be a sufficiently small 400 nm or less, the spread of the current in the horizontal direction is suppressed to about the stripe width W of the p-type AlGaInP clad layer 104.

On the other hand, since a thickness of a guide layer 102a on the n-type AlGaInP clad Layer 102 side is increased to make the SCH structure asymmetric, a refractive index difference Δn (=n1−n2) between a portion of the waveguide in the horizontal direction corresponding to the stripe portion 107 and portions corresponding to the two sides thereof is kept at a small value between 0.001 and 0.003 able to continuously generate pulsation.

Accordingly, the spread of the light in the horizontal direction becomes larger than the stripe width W of the p-type AlGaInP clad layer 104 and the light is narrowed such as with a so-called index guide. Consequently, the pulsation is generated stably and continuously without the pulsation stopping being produced.

Namely, self-pulsation is performed stably.

Figure 4:
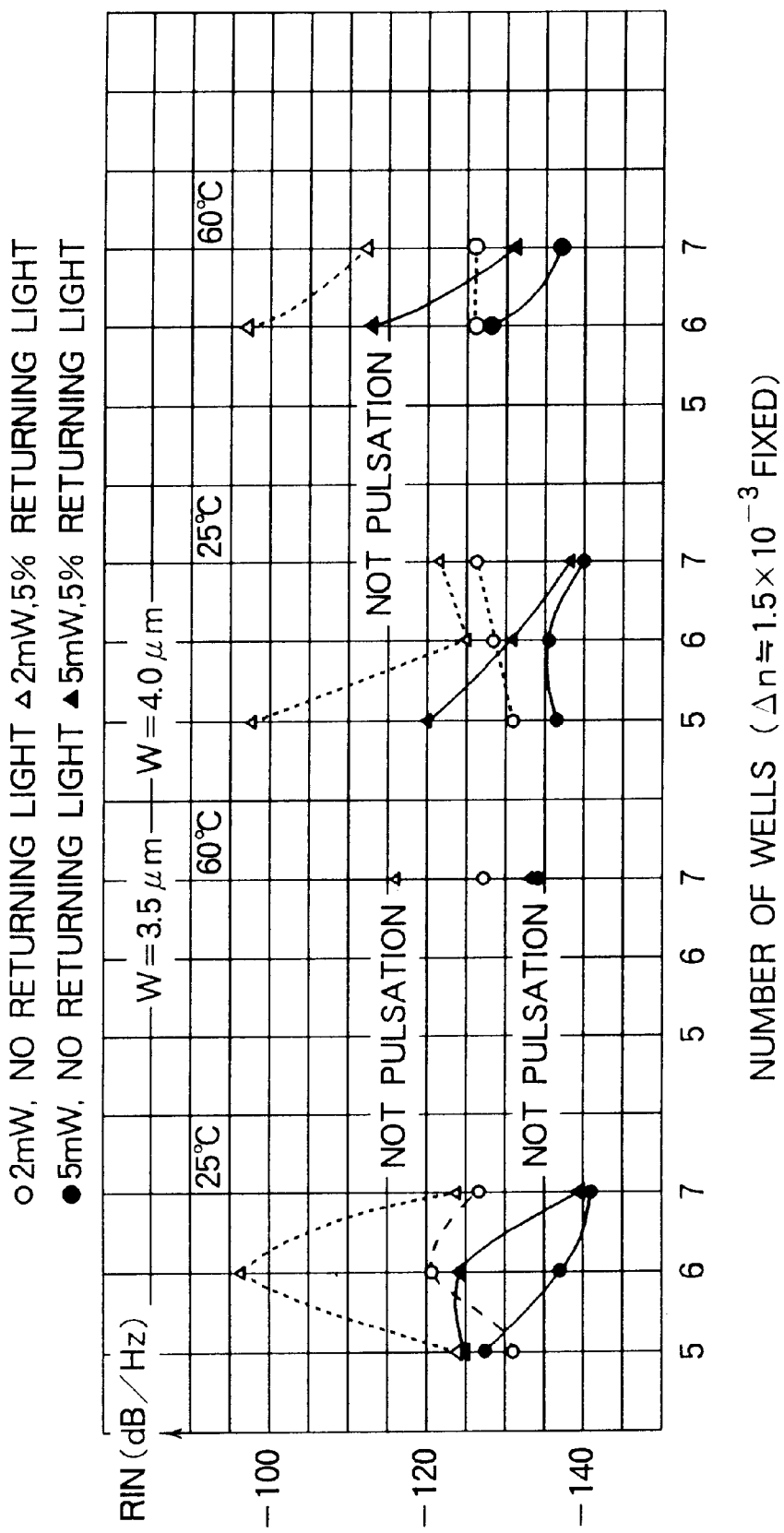
FIG. 4 is a view of the dependency of the structural parameters in a case where the structural parameters of a number of wells, a refractive index difference Δn, and a stripe width W of the self-pulsation type semiconductor laser in FIG. 1 are changed or fixed.
Figure 5:
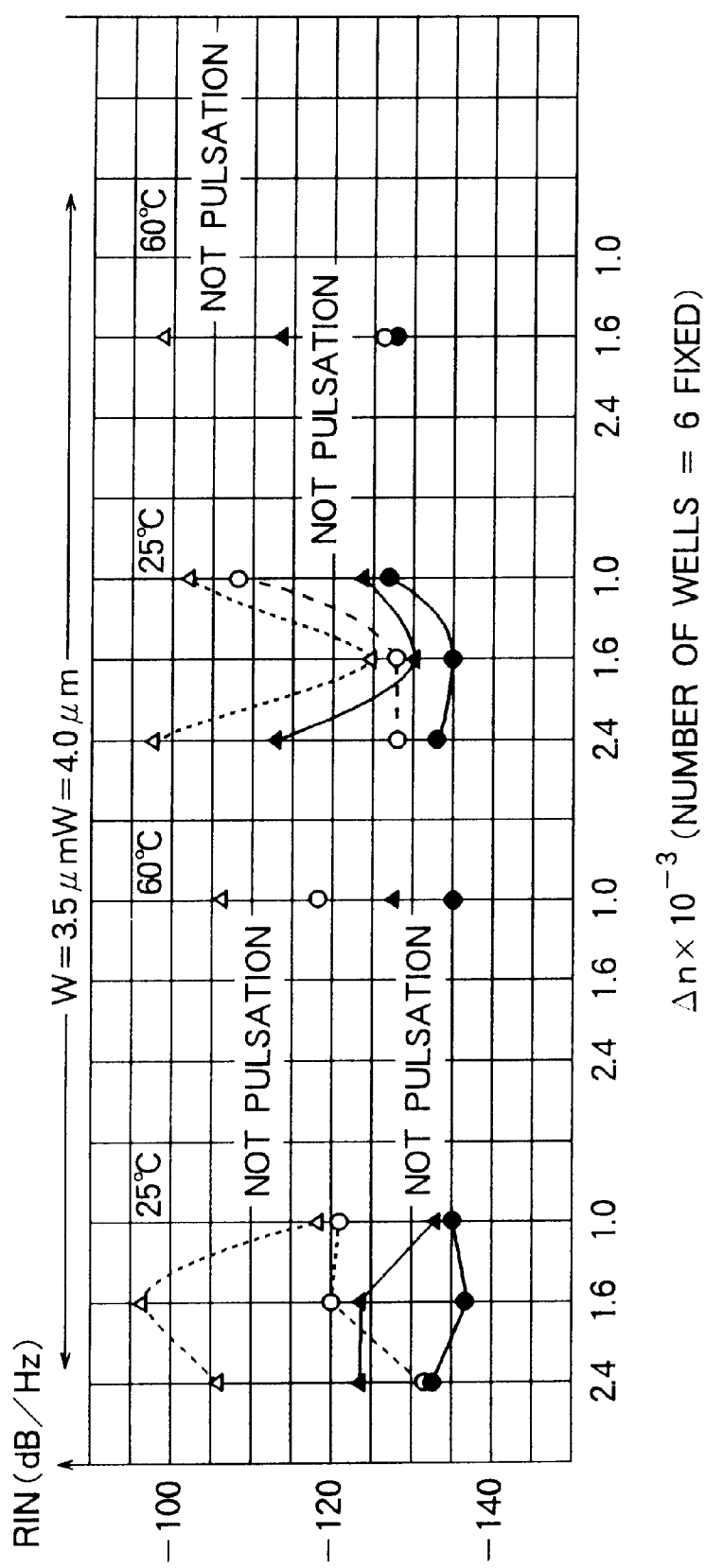
FIG. 5 is another view of the dependency of the structural parameters in a case where the structural parameters of a number of wells, a refractive index difference Δn, and a stripe width W of the self-pulsation type semiconductor laser in FIG. 1 are changed or fixed.

FIGS. 4 and 5 are views of the dependency of the structural parameters in the case where the structural parameters of the number of wells, refractive index difference Δn, and the stripe width W in the self-pulsation type semiconductor laser of FIG. 1 are changed.

In FIG. 4, the ordinate indicates the number of wells (where Δn≈1.5×10−3) and the abscissa indicates a relative noise RIN.

Also, in FIG. 5, the ordinate indicates the refractive index difference Δn (where number of wells=6) and the abscissa indicates the relative noise RIN.

The two figures show the results of simulation at an ordinary temperature (25° C.) and at a high temperature (60° C.).

As will be understood from the figures, the structure by which the stablest self-pulsation can be obtained is one where the stripe width W is 3.5 μm, the number of wells is seven, and the refractive index difference Δn is $1.6 \times 10^{-3}$ (0.0016).

Namely, the results of the simulation back up the legitimacy of the condition that the stripe width W of the above mesa-shaped bottom portion be set to be not more than 4.0 μm and that the refractive index difference Δn be 0.003 to 0.001 or, if possible, 0.002 to 0.0012.

As explained above, according to the first embodiment, in order to generate stable pulsation, the current is designed not to spread in the horizontal direction of the active layer and a wide saturable absorbing region is secured so as to spread the light spot. Therefore, the thickness d of the p-type AlGaInP clad layer 104 with the current narrowing layer 103 is set to be, for example, d≦400 nm, preferably d≦350 nm. Further, in order to keep the refractive index difference Δn (=n1−n2) between the portion of the waveguide in the horizontal direction corresponding to the stripe portion 107 and portions corresponding to the two sides thereof at a small value between 0.001 and 0.003 capable of continuously generating pulsation, the thickness of a guide layer 102a on the n-type AlGaInP clad layer 102 side is increased layer to make the SCH structure asymmetrical. Therefore, there is an advantage that a self-pulsation type semiconductor laser which has a high yield in manufacture and can perform stable self-pulsation even when operating at a high temperature and at a high output can be realized.

Second Embodiment

Figure 6:
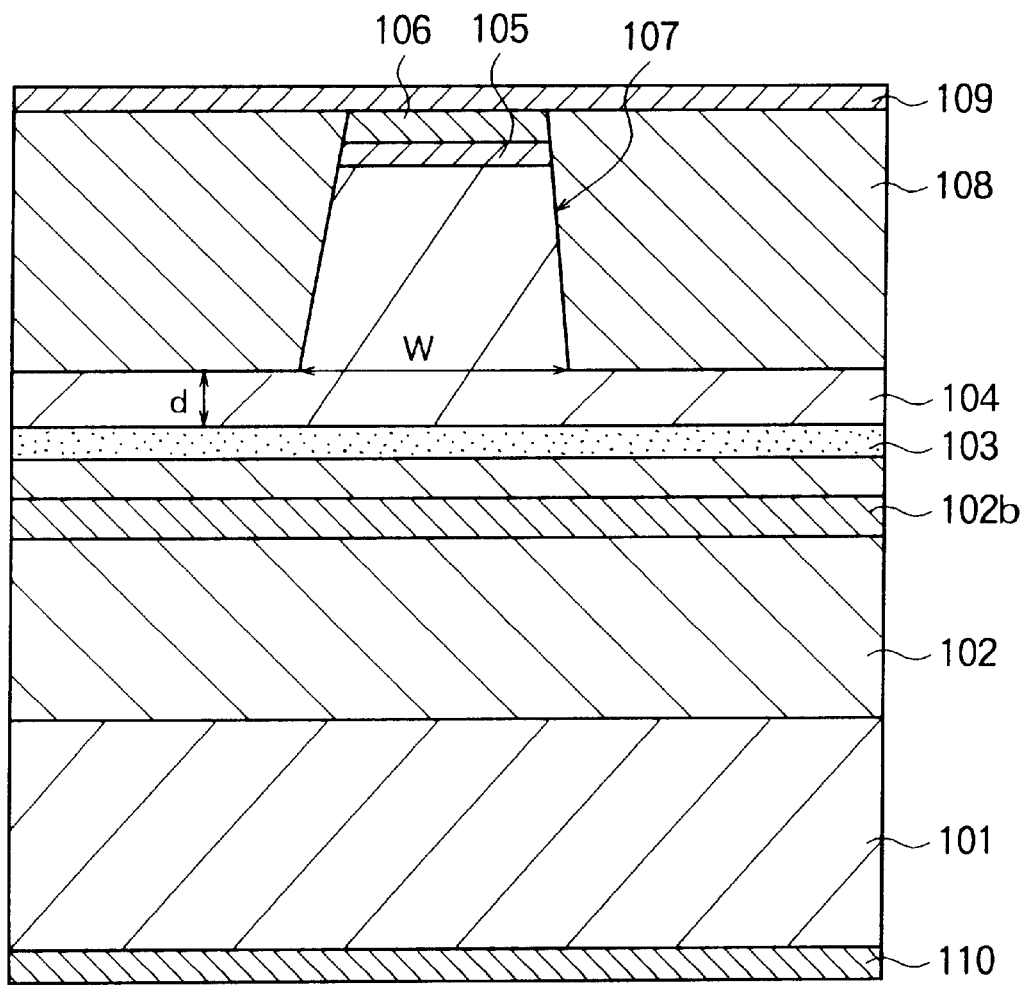
FIG. 6 is a cross-sectional view of a self-pulsation type semiconductor laser according to a second embodiment of the present invention.
Figure 7:
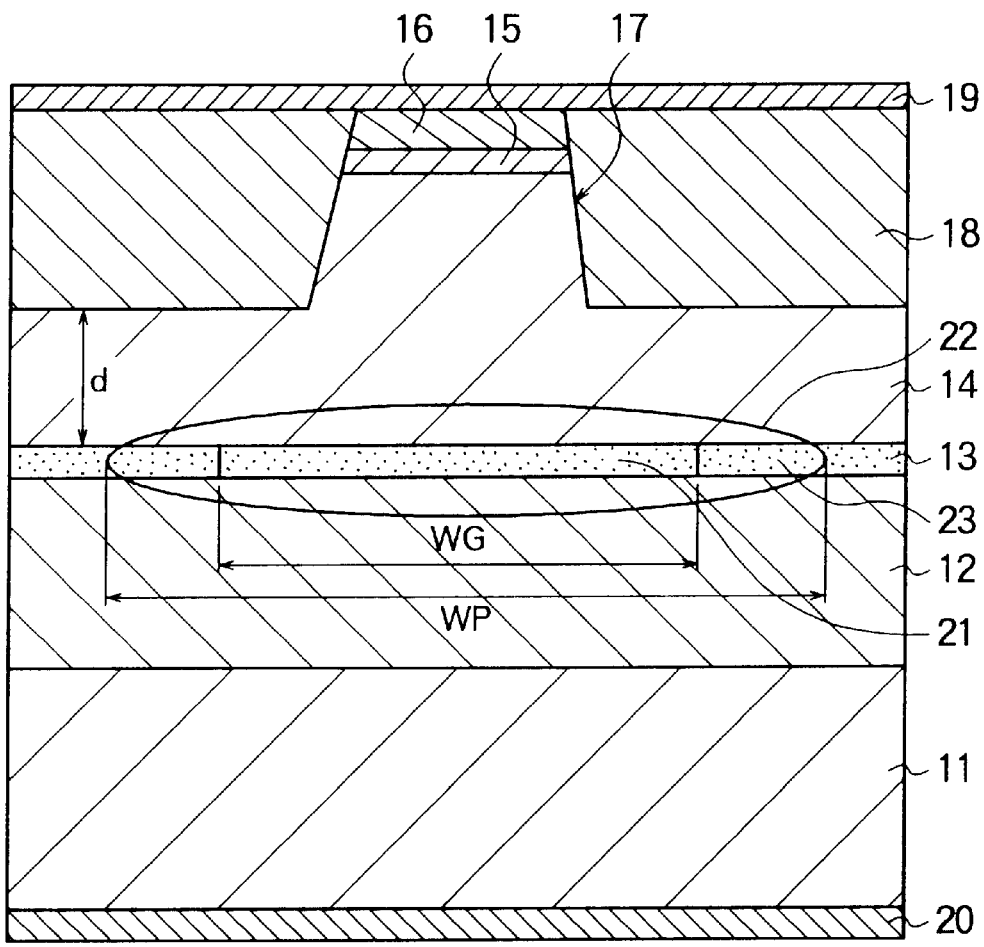
FIG. 7 is a cross-sectional view of an example of the configuration of a self-pulsation type semiconductor laser of the related art.
Figure 8:
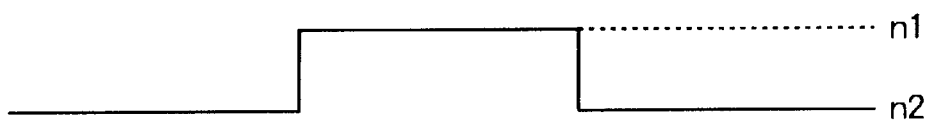
FIG. 8 is a rough graph of a refractive index distribution of the self-pulsation type semiconductor laser shown in FIG. 7.
Figure 9:
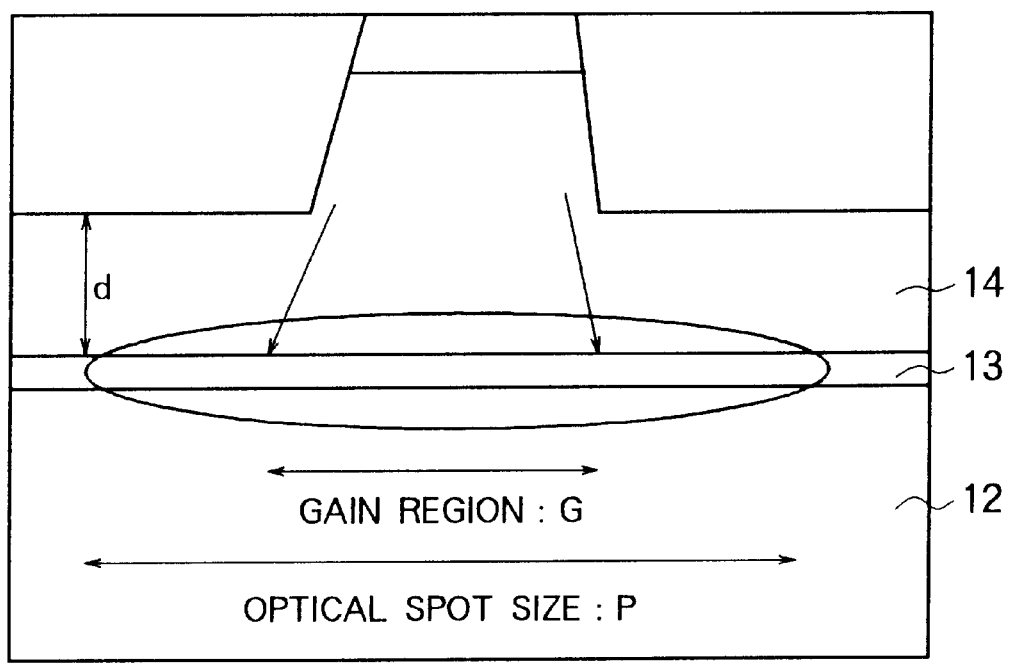
FIG. 9 is a schematic view of a relationship of a gain width of a self-pulsation type semiconductor laser of the related art and a light spot width.

FIG. 6 is a cross-sectional view of a self-pulsation type semiconductor laser according to a second embodiment of the present invention.

The point of difference of the second embodiment from the first embodiment is that a mode pull-in layer 102b is provided in the n-type AlGaInP clad layer 102 in order to pull in a light mode to the n-side, that is, to keep the refractive index difference Δn in the horizontal direction at a small value between 0.001 and 0.003 capable of continuously generating pulsation.

The configuration of the mode pull-in layer 102b can be realized by itself or in addition to increasing the thickness of the guide layer 102a on the n-type AlGaInP clad layer 102 shown in the first embodiment to make the SCH structure asymmetrical.

Especially, providing it in addition to making the SCH structure asymmetrical is effective when adjustment of the refractive index difference Δn would be difficult only by making the SCH structure asymmetrical.

The mode pull-in layer 102b is configured by inserting a layer close to an active layer or guide layer having a higher refractive index than the n-type clad layer 102 into the clad layer.

Specifically, a composition x of Al in AlGaInP is set to be (composition of Al in active layer) <x< (composition of Al in clad layer) or, in the present embodiment, a value of 0<x<0.7, for example, 0.5.

Accordingly, the mode pull-in layer 102b is comprised, for example, of $(Al_{0.5}Ga_{0.5})_{0.5}In_{0.5}P$.

Note that a large composition is preferable due to a band-gap of the active layer in order to prevent light absorption.

According to the second embodiment, in the same way as in the above first embodiment, in order to generate stable pulsation, the current is designed not to spread in the horizontal direction of the active layer and a wide saturable absorbing region is secured so as to spread the light spot. Therefore, the thickness d of the p-type AlGaInP clad layer 104 with the current narrowing layer 108 is set to be, for example, d≦400 nm, preferably d≦350 nm. Further, in order to keep the refractive index difference Δn (=n1−n2) between the portion of the waveguide in the horizontal direction corresponding to the stripe portion 107 and portions corresponding to the two sides thereof at a small value between 0.001 and 0.003 capable of continuously generating pulsation, the thickness of a guide layer 102a on the n-type AlGaInP clad layer 102 side is increased layer to make the SCH structure asymmetrical. Therefore, there is an advantage that a self-pulsation type semiconductor laser which has a high yield in manufacture and can perform stable self-pulsation even when operating at a high temperature and at a high output can be realized.

Note that in the above first and second embodiments, although the explanation was made with reference to the example of a AlGaInP/GaInP based self-pulsation type semiconductor laser, but needless to say the present invention can also be applied to a variety of other lasers such as AlGaAs/GaAs, AlGaN/InGaN, and ZnMgSSe/ZnS based lasers.

Summarizing the effects of the invention, as explained above, according to the present invention, there is the advantage that a self-pulsation type semiconductor laser which has a high yield in manufacture and can perform stable self-pulsation even when operating at a high temperature and a high output can be realized.

While the invention has been described with reference to specific embodiment chosen for purpose of illustration, it should be apparent that numerous modifications could be made thereto by those skilled in the art without departing from the basic concept and scope of the invention.

What is claimed is:

1. A self-pulsation type semiconductor laser, comprising:
   a first conductivity type first clad layer,
   an active layer formed on the first clad layer;
   a second conductivity type second clad layer formed on the active layer;
   a current narrowing structure comprising first conductivity type current narrowing layers buried at portions at the two sides of a stripe portion formed in the second clad layer;
   saturable absorbing regions formed on the two sides of the active layer inside a laser resonator; and
   a holding mechanism for holding a predetermined refractive index difference Δn of a waveguide in a horizontal direction parallel to a pn junction and perpendicular to a longitudinal direction of the resonator within a range capable of continuously generating pulsation;
   a thickness d of the second clad layer outside the waveguide being set to a small value capable of suppressing the spread in the horizontal direction of a current introduced to the active layer through the stripe portion to close to a stripe width W of a bottom portion of the stripe portion.

2. A self-pulsation type semiconductor laser as set forth in claim 1, wherein the refractive index difference Δn is 0.003 to 0.001.

3. A self-pulsation type semiconductor laser as set forth in claim 1, wherein the thickness d of the second clad layer is 400 nm or less.

4. A self-pulsation type semiconductor laser as set forth in claim 2, wherein the thickness d of the second clad layer is 400 nm or less.

5. A self-pulsation type semiconductor laser as set forth in claim 1, wherein the stripe width W of the bottom portion of the stripe portion is 4 μm or less.

6. A self-pulsation type semiconductor laser as set forth in claim 4, wherein the stripe width W of the bottom portion of the stripe portion is 4 μm or less.

7. A self-pulsation type semiconductor laser, comprising:
   a first conductivity type first clad layer;
   an active layer formed on the first clad layer;
   a second conductivity type second clad layer formed on the active layer;
   a current narrowing structure comprising first conductivity type current narrowing layers buried at portions at the two sides of a stripe portion formed in the second clad layer;
   saturable absorbing regions formed on the two sides of the active layer inside a laser resonator; and
   a holding mechanism for holding a predetermined refractive index difference Δn of a waveguide in a horizontal direction parallel to a pn junction and perpendicular to a longitudinal direction of the resonator within a range capable of continuously generating pulsation by making a thickness of a guide layer at the first conductivity type first clad layer side larger than the thickness of a guide layer at the second conductivity type second clad layer side to make an asymmetric structure;
   a thickness d of the second clad layer outside the waveguide being set to a small value capable of suppressing the spread in the horizontal direction of a current introduced to the active layer through the stripe portion to close to a stripe width W of a bottom portion of the stripe portion.

8. A self-pulsation type semiconductor laser as set forth in claim 7, wherein the refractive index difference Δn is 0.003 to 0.001.

9. A self-pulsation type semiconductor laser as set forth in claim 7, wherein the thickness of the second clad layer is 400 nm or less.

10. A self-pulsation type semiconductor laser as set forth in claim 8, wherein the thickness of the second clad layer is 400 nm or less.

11. A self-pulsation type semiconductor laser as set forth in claim 7, wherein the stripe width W of the bottom portion of the stripe portion is 4 μm or less.

12. A self-pulsation type semiconductor laser as set forth in claim 10, wherein the stripe width W of the bottom portion of the stripe portion is 4 μm or less.

13. A self-pulsation type semiconductor laser, comprising:
a first conductivity type first clad layer;
an active layer formed on the first clad layer;
a second conductivity type second clad layer formed on the active layer;
a current narrowing structure comprising first conductivity type current narrowing layers buried at portions at the two sides of a stripe portion formed in the second clad layer;
saturable absorbing regions formed on the two sides of the active layer inside a laser resonator; and
a mode pull-in layer in the first conductivity type first clad layer for pulling in a light mode to the first conductivity side so so to keep a predetermined refractive index difference Δn of a waveguide in a horizontal direction parallel to a pn junction and perpendicular to a longitudinal direction of the resonator within a range capable of continuously generating pulsation;
a thickness d of the second clad layer outside the waveguide being set to a small value capable of suppressing the spread in the horizontal direction of a current introduced to the active layer through the stripe portion to close to a stripe width W of a bottom portion of the stripe portion.

14. A self-pulsation type semiconductor laser as set forth in claim 13, wherein the refractive index difference Δn is 0.003 to 0.001.

15. A self-pulsation type semiconductor laser as set forth in claim 13, wherein the thickness d of the second clad layer is 400 nm or less.

16. A self-pulsation type semiconductor laser as set forth in claim 14, wherein the thickness of the second clad layer is 400 nm or less.

17. A self-pulsation type semiconductor laser as set forth in claim 13, wherein the stripe width W of the bottom portion of the stripe portion is 4 μm or less.

18. A self-pulsation type semiconductor laser as set forth in claim 16, wherein the stripe width W of the bottom portion of the stripe portion is 4 μm or less.

19. A self-pulsation type semiconductor laser is set forth in claim 13, wherein the mode pull-in layer is formed by setting the refractive index higher than the refractive index of the first clad layer.

20. A self-pulsation type semiconductor laser, comprising:
a first conductivity type first clad layer;
an active layer formed on the first clad layer;
a second conductivity type second clad layer formed on the active layer;
a current narrowing structure comprising first conductivity type current narrowing layers buried at portions at the two sides of a stripe portion formed in the second clad layer;
saturable absorbing regions formed on the two sides of the active layer inside a laser resonator;
a holding mechanism for holding a predetermined refractive index difference Δn of a waveguide in a horizontal direction parallel to a pn junction and perpendicular to a longitudinal direction of the resonator within a range capable of continuously generating pulsation by making a thickness of a guide layer at the first conductivity type first clad layer side larger than the thickness of a guide layer at the second conductivity type second clad layer side to make an asymmetric structure; and
a mode pull-in layer in the first conductivity type first clad layer for pulling in a light mode to the first conductivity side;
a thickness d of the second clad layer outside the waveguide being set to a small value capable of suppressing the spread in the horizontal direction of a current introduced to the active layer through the stripe portion to close to a stripe width W of a bottom portion of the stripe portion.

21. A self-pulsation type semiconductor laser as set forth in claim 20, wherein the refractive index difference Δn is 0.003 to 0.001.

22. A self-pulsation type semiconductor laser as set forth in claim 20, wherein the thickness d of the second clad layer is 400 nm or less.

23. A self-pulsation type semiconductor laser as set forth in claim 21, wherein the thickness d of the second clad layer is 400 nm or less.

24. A self-pulsation type semiconductor laser as set forth in claim 20, wherein the stripe width W of the bottom portion of the stripe portion is 4 μm or less.

25. A self-pulsation type semiconductor laser as set forth in claim 23, wherein the stripe width W of the bottom portion of the stripe portion is 4 μm or less.

26. A self-pulsation type semiconductor laser as set forth in claim 20, wherein the mode pull-in layer is formed by setting the refractive index higher than the refractive index of the first clad layer.

27. A self-pulsation type semiconductor laser, comprising:
a substrate;
a first conductivity type first clad layer formed on the substrate;
an active layer formed on the first clad layer;
a second conductivity type second clad layer formed on the active layer;
a cap layer formed on the second clad layer; and
a current narrowing layer formed at the two sides of the second clad layer;
the active layer having a separate confinement heterostructure (SCH) comprising a first guide layer provided on the first clad layer side and a second guide layer provided on the second clad layer side;
a thickness of the first guide layer being larger than the thickness of the second guide layer; and
a thickness of the second clad layer between the active layer and the current narrowing layer being 400 nm or less.

28. A self-pulsation type semiconductor laser as set forth in claim 27, wherein a stripe portion of the semiconductor laser is formed by the current narrowing layer.

29. A self-pulsation type semiconductor laser as set forth in claim 28, wherein the stripe width is 4 μm or less.

30. A self-pulsation type semiconductor laser as set forth in claim 27, wherein the active layer comprises a multi quantum well (MQW) structure.

31. A self-pulsation type semiconductor laser, comprising:

a substrate;

a first conductivity type first clad layer formed on the substrate;

an active layer formed on the first clad layer;

a second conductivity type second clad layer formed on the active layer;

a cap layer formed on the second clad layer;

a current narrowing layer formed at the two sides of the second clad layer; and a pull-in layer formed in the first clad layer and having a higher refractive index than the first clad layer;

the thickness of the second clad layer between the active layer and the current narrowing layer being 400 nm or less.

32. A self-pulsation type semiconductor laser, comprising:

a substrate;

a first conductivity type first clad layer formed on the substrate;

an active layer formed on the first clad layer;

a second conductivity type second clad layer formed on the active layer;

a cap layer formed on the second clad layer;

a current narrowing layer formed at the two sides of the second clad layer; and a pull-in layer formed in the first clad layer and having a higher refractive index than the first clad layer;

the thickness of the second clad layer between the active layer and the current narrowing layer being 400 nm or less;

the active layer having a separate confinement heterostructure (SCH) comprising a first guide layer provided on the first clad layer side and a second guide layer provided on the second clad layer side; and a thickness of the first guide layer being larger than the thickness of the second guide layer.

33. A self-pulsation type semiconductor laser as set forth in claim 31, wherein a stripe portion of the semiconductor laser is formed by the current narrowing layer.

34. A self-pulsation type semiconductor laser as set forth in claim 33, wherein the stripe width is 4 $\mu$m or less.

35. A self-pulsation type semiconductor laser as set forth in claim 32, wherein the active layer comprises an MQW structure.

36. A self-pulsation type semiconductor laser as set forth in claim 31, wherein the pull-in layer is larger than an energy gap of the active layer.

* * * * *